United States Patent
Kaul et al.

(10) Patent No.: US 8,872,595 B2
(45) Date of Patent: Oct. 28, 2014

(54) BINARY BI-PHASE SHIFT MODULATOR

(75) Inventors: Roger D. Kaul, Skyesville, MD (US); Jeffrey S. Pulskamp, Leesburg, VA (US); Ronald G. Polcawich, Derwood, MD (US); Sarah Bedair, Bethesda, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 128 days.

(21) Appl. No.: 13/609,623

(22) Filed: Sep. 11, 2012

(65) Prior Publication Data

US 2014/0070902 A1    Mar. 13, 2014

(51) Int. Cl.
*H03C 3/00*        (2006.01)

(52) U.S. Cl.
CPC ........................................ *H03C 3/00* (2013.01)
USPC ........... 332/144; 332/146; 332/103; 310/317; 333/24.1; 333/150; 367/119; 375/308

(58) Field of Classification Search
CPC ............ H03C 3/00; H04L 27/32; H04L 27/00
USPC .......... 332/144, 146, 103; 310/317; 333/24.1, 333/150; 367/119; 375/308
See application file for complete search history.

(56) References Cited

U.S. PATENT DOCUMENTS

| | | | | |
|---|---|---|---|---|
| 3,699,482 A * | 10/1972 | Ash et al. | ....................... | 333/150 |
| 3,713,048 A * | 1/1973 | Dias | ............................... | 332/177 |
| 3,949,324 A * | 4/1976 | Lowe et al. | .................... | 332/117 |
| 4,663,746 A * | 5/1987 | DeMaria et al. | ............. | 367/119 |
| 7,728,784 B2 * | 6/2010 | Mohamadi | ..................... | 343/853 |
| 7,732,977 B2 * | 6/2010 | Martin et al. | ................. | 310/317 |
| 8,081,707 B2 * | 12/2011 | Bobier et al. | ................. | 375/295 |

* cited by examiner

*Primary Examiner* — Arnold Kinkead
(74) *Attorney, Agent, or Firm* — Alan I. Kalb; Eric B. Compton

(57) ABSTRACT

A binary bi-phase shift modulator having an input piezoelectric transducer and an output piezoelectric transducer connected in series between a radio frequency input and a radio frequency output. A fixed DC pole voltage having a first polarity is connected to one of the transducers. A DC switched pole voltage is connected to the other transducer which switches between the pole voltage of the first polarity and a pole voltage of the opposite polarity in accordance with a binary data signal. The polarity of the radio frequency input relative to the radio frequency output varies as a function of the polarity of the DC switched pole voltage.

20 Claims, 2 Drawing Sheets

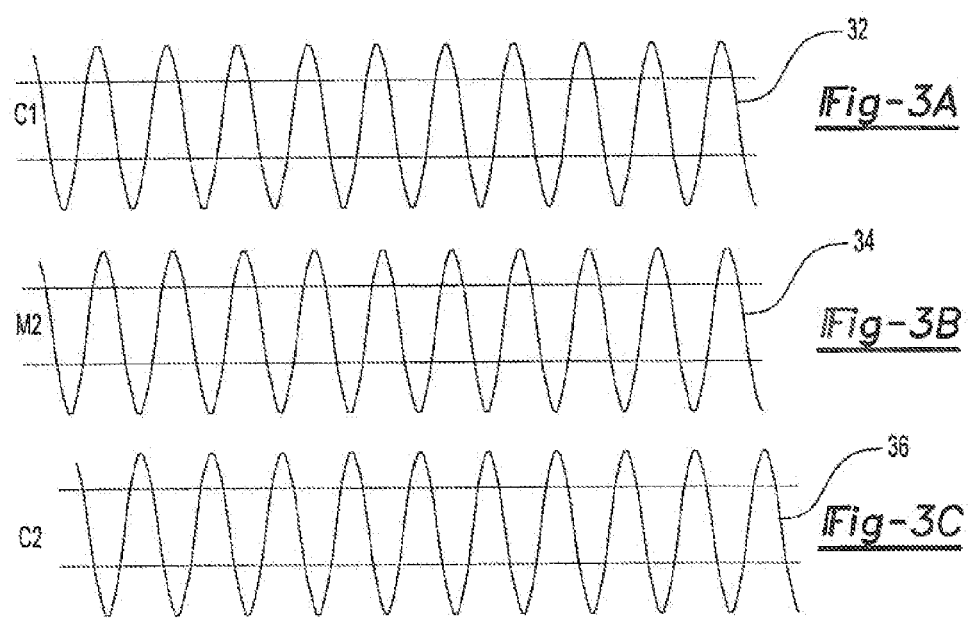

BINARY BI-PHASE SHIFT MODULATOR

GOVERNMENT INTEREST

The invention described herein may be manufactured, used, and licensed by or for the United States Government.

BACKGROUND OF THE INVENTION

I. Field of the Invention

The present invention relates generally to modulators and, more particularly, to a bi-phase piezoelectric resonator modulator.

II. Description of Relevant Art

There are many applications for low speed radio frequency modulators at relatively low frequencies, i.e. less than 100 megahertz. For example, such modulators can be used in conjunction with remote sensors to transmit the sensor data from the location of the sensor and to a central station. Such modulators are used in many types of sensors such as troop movement or tank movement sensors, weather condition sensors, and the like.

In these types of sensor applications, as well as other applications, the speed of the modulator is not critical and relatively slow speed transmissions of data are sufficient for the application. Instead, a much more critical requirement of such modulators is that the modulator consumes as little power as possible. This is particularly true since the sensor is often installed at locations lacking electric power. In these situations, battery power, or even solar panel power, must be sufficient to power the modulator as well as the other associated equipment. To date, the battery or solar panel requirements necessary to power the modulator and associated equipment are relatively large and/or bulky.

SUMMARY OF THE PRESENT INVENTION

The present invention provides a bi-phase resonator modulator which overcomes all of the above mentioned disadvantages of the previously known modulators.

In brief, the present invention provides a bi-phase shift modulator having an input piezoelectric transducer and an output piezoelectric transducer which are connected in series between a radio frequency input and a radio frequency output. A source of radio frequency, e.g. a sinusoidal rye, is coupled to the input transducer. The frequency of the radio frequency signal is relatively low, i.e. less than 100 megahertz and preferably less than 30 megahertz.

A DC pole voltage having a first polarity is connected to one of the transducers. Blocking, capacitors are also connected in series between each transducer and its associated input or output. Consequently, the blocking capacitors minimize or even eliminate the current draw from the source of the bias or pole voltage.

A DC switched bias or pole voltage is connected to the other transducer which switches between a pole voltage having the same polarity as the first transducer, and a pole voltage of the opposite polarity in accordance with a binary data signal. Thus, the DC switched pole voltage phase modulates the radio frequency signal between a first state in which the radio frequency input signal is in phase with the radio frequency output signal, and a second state in which the phase of the radio frequency input is 180 degrees out of phase from the radio signal output. The actual phase of the DC switching pole voltage varies in unison with the binary data signal.

Subsequent demodulation of the phase modulated signal at the base or central station extracts the data from the radio frequency signal.

Preferably, the piezoelectric transducers are both lead zirconate titanate (PZT) acoustic resonators. Furthermore, the piezoelectric transducers are preferably dimensioned so that their resonant frequency coincides to the frequency of the radio frequency signal to minimize signal loss from the radio frequency input and to the radio frequency output. Furthermore, the entire modulator is preferably implemented as an integrated circuit.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which:

FIGS. 3A-3C are waveforms illustrating the operation of the modulator.

DETAILED DESCRIPTION OF A PREFERRED EMBODIMENT OF THE PRESENT INVENTION

Figure 1:
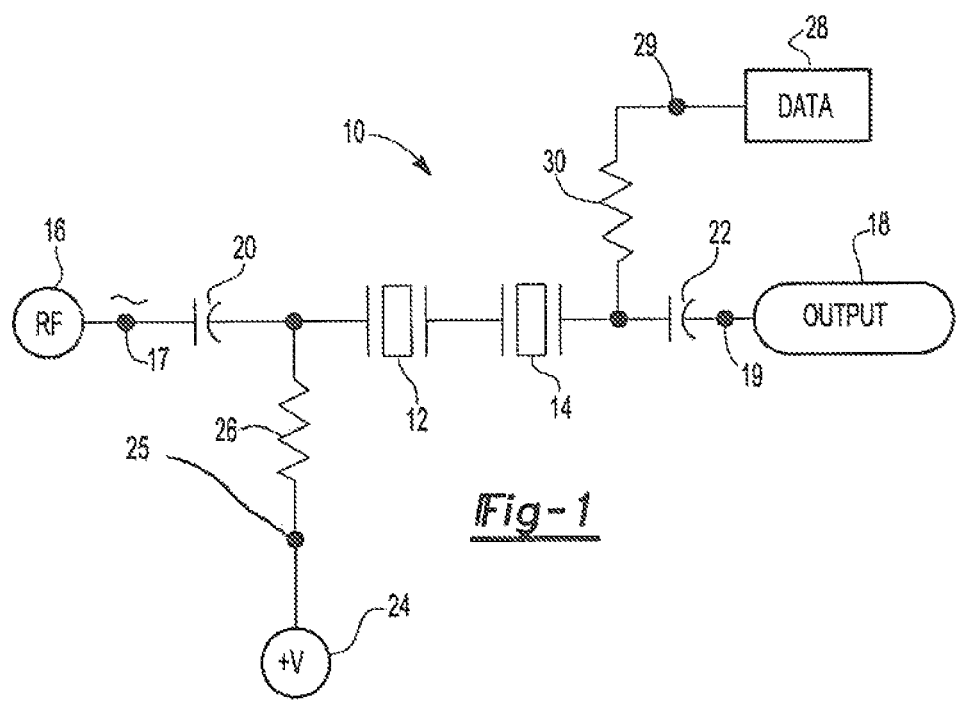
FIG. 1 is a schematic view of a preferred embodiment of the present invention.

With reference first to FIG. 1, a preferred embodiment of a bi-phase shift modulator 10 according to the present invention is shown. The modulator 10 includes an input piezoelectric transducer 12 and an output piezoelectric transducer 14. The input and output transducers 12 and 14, respectively, are connected in series between a radio frequency input 16 and a radio frequency output 18. A blocking capacitor 20 is also connected in series between the transducer 12 and the radio frequency input signal 16 and, similarly, a blocking capacitor 22 is connected in series between the output of the output transducer 14 and the Output 18 for the modulator.

The radio frequency signal 16 is preferably a sinusoidal signal of a relatively low frequency, i.e. less than 100 megahertz. Furthermore, the value of the blocking capacitors 20 and 22 is selected to block DC, but pass a signal at the frequency of the RE signal 16. For example, assuming a frequency of 19 megahertz for the radio frequency signal 16, a value of about 31 picofarads for each capacitor 20 and 22 is sufficient to pass the signal from the radio frequency input 16, through the blocking capacitors 20 and 22 and transducers 12 and 14, and to the output 18.

The input and output transducers 12 and 14 are preferably piezoelectric lead zirconate titanate (PZT) acoustic resonators. The transducers are also dimensioned to resonate at substantially the frequency of the radio frequency signal 16. By matching the resonant frequency of the transducers 12 and 14 to the frequency of the radio frequency signal 16, signal loss from the radio frequency input 16 and to the radio frequency output 18 is minimized.

A DC voltage source 24 having a first polarity, e.g. +8 volts, is connected through a resistor 26 to pole or bias the input transducer 12. Since the resistor 26 is connected in between the input transducer 12 and the blocking capacitor 20, essentially zero current flows through the resistor 26. Consequently, power consumption from the bias or pole voltage source 24 is eliminated, or at least minimized.

A switched DC bias or pole voltage source 28 is electrically connected through a resistor 30 to the output of the output transducer 14 and the blocking capacitor 22. Like the blocking capacitor 20, the blocking capacitor 22 eliminates or at least minimizes the current flow through the resistor 30 and thus minimizes or eliminates the power consumption from the DC switched bias or pole source 28.

The output from the DC switched voltage source 28 is switched in accordance with data from a data stream between a first value equal to the poling voltage of the fixed DC voltage 24 of the first polarity and a pole voltage of the same magnitude as the voltage source 24, but of the opposite polarity. For example, assuming that the voltage of the fixed DC pole source 24 is 7 volts, the DC switched voltage source 28 will switch the pole voltage applied to the output transducer 14 between +7 volts and −7 volts depending upon the digital or binary value of the data.

With reference now to FIGS. 3A-3C, the net effect of changing the polarity of the pole voltage on the output transducer 14 is illustrated. More specifically FIG. 3A illustrates a radio frequency sinusoidal signal 32 at the radio frequency input 16 (FIG. 1). Assuming that the pole voltage applied by the DC switching source 28 to the output transducer 14 has the same polarity as the fixed pole voltage source 24, an output signal 34 at the output 18 is in phase with the input signal 32 as shown in FIG. 3B. Consequently, the phase of the input signal 32 is the same as the output signal 34 as long as the polarity, either positive or negative, of the pole voltage applied to both the input transducer 12 and output transducer 14 is the same.

Conversely, as shown in FIG. 3C, when the polarity of the pole voltage applied by the DC switching voltage source to the output transducer 14 is the opposite from the polarity of the fixed voltage pole source 24, the output signal 36 is shifted 180 degrees out of phase from the input signal 34. Consequently, since the output from the DC switched voltage source 28 switches between positive polarity and negative polarity in unison with a digital or binary data signal, the output signal 32 (FIG. 3A) or 36 (FIG. 3C) is phase encoded with the binary or digital information. The data may be subsequently extracted by phase demodulation at the central station (not shown).

Although FIG. 1 illustrates the fixed pole voltage source 24 as connected to the input transistor 12 and the DC switched pole voltage source 28 connected to the output transistor 14, the voltage sources 24 and 28 may be switched without affecting the operation of the modulator 10. Likewise, although the fixed pole voltage source 24 has been described as a positive voltage source, it may alternatively have a negative polarity without affecting the operation of the modulator 10.

Figure 2:
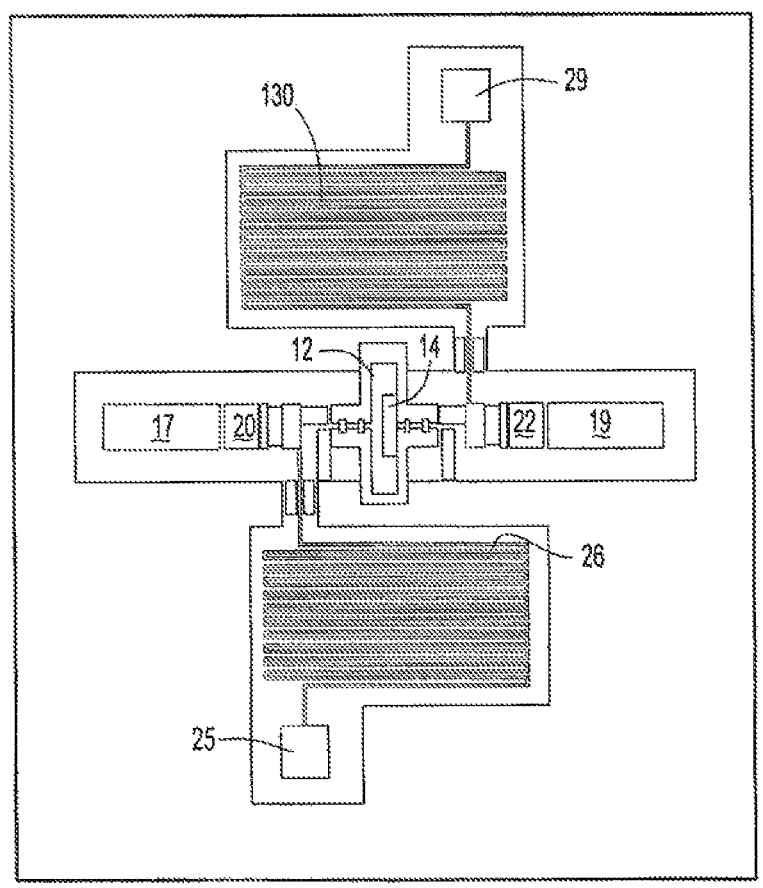
FIG. 2 is an enlarged vies illustrating an implementation of the present invention on an integrated circuit.

With reference now to FIG. 2, the entire modulator, except for the radio frequency source 16 and pole voltage sources 24 and 28, is preferably implemented as an integrated circuit. As shown in FIG. 2, the piezoelectric transducers 12 and 14 together with their associated DC blocking capacitors 20 and 22 are connected in series between to terminals 17 and 19. These terminals 17 and 19 are adapted for connection with the radio frequency signal source 16 and an appropriate output 18, such as an antenna. Similarly, a terminal 25 is adapted for connection with the fixed DC voltage pole source 24 through the resistor 26 to bias the first transducer 12. Similarly, a terminal 29 is adapted for connection with the DC binary switched pole voltage source 28 to bias the output transistor 14 through a resistor 30.

From the foregoing, it can be seen that the present invention provides a binary bi-phase shift modulator to modulate a radio signal by phase modulation which consumes extremely little power. Having described our invention, however, many modifications thereto will become, apparent to those skilled in the art to which it pertains without deviation from the spirit of the invention as defined by the scope of the appended claims.

The invention claimed is:

1. A binary bi-phase shift modulator comprising:
an input piezoelectric transducer and an output piezoelectric transducer connected in series between a radio frequency input and radio frequency output,
a DC pole voltage source connected to one of said transducers configured to apply a pole voltage of a first polarity,
a DC switched pole voltage source connected to the other transducer configured to apply a pole voltage which switches between said pole voltage of said first polarity and a pole voltage of the opposite polarity in accordance with a binary data signal so that the phase of the radio frequency input relative to the radio frequency output varies as a function of the polarity of the DC switched pole voltage.

2. The modulator as defined in claim 1 wherein said input transducer is a lead zirconate titanate transducer.

3. The modulator as defined in claim 1 wherein said output transducer is a lead zirconate titanate transducer.

4. The modulator as defined in claim 1 and comprising a first DC blocking capacitor connected in series between the radio frequency input and said input transducer.

5. The modulator as defined in claim 4 and comprising a second DC blocking capacitor connected in series between the radio frequency output and said output transducer.

6. The modulator as defined in claim 5 wherein said transducers and said capacitors are implemented as an integrated circuit.

7. A method for modulating a radio frequency signal comprising:
connecting an input piezoelectric transducer and an output piezoelectric transducer in series between a modulator input and a modulator output,
supplying a radio frequency signal to said modulator input,
applying a pole voltage of a first polarity to one of said transducers,
phase modulating said modulator output relative to said modulator input by applying a pole voltage on the other transducer that switches between said pole voltage of said first polarity and a pole voltage of the opposite polarity in accordance with a binary data signal.

8. The method as defined in claim 7 wherein said input transducer is a lead zirconate titanate transducer.

9. The method as defined in claim 7 wherein said output transducer is a lead zirconate titanate transducer.

10. The modulator as defined in claim 1 wherein the DC pole voltage source applies a fixed DC voltage of the first polarity.

11. The modulator as defined in claim 1 wherein the resonant frequencies of the input piezoelectric transducer and the output piezoelectric transducer are matched to the frequency of the radio frequency of a signal which is modulated.

12. The modular as defined in claim 1 wherein the modular output is shifted 180 degrees out of phase from the modulator input.

13. The modulator as defined in claim 5 further comprising: a first resistor connected between the DC pole voltage source and the one transducer, and a second resistor connected between the DC switched pole voltage source and the other transducer, wherein an end of the first resistor connects to the connection between the first DC blocking capacitor and the one transducer, and an end of the second resistor connects to the connection between the other transducer and the second DC blocking capacitor.

14. The modulator as defined in claim 1 further comprising: a first terminal adapted to connect the DC pole voltage source to the one transducer, and a second terminal adapted to connect the DC switched pole voltage source to the other transducer.

15. The method as defined in claim 7 wherein the pole voltage of the first polarity is a fixed DC voltage.

16. The method as defined in claim 7 wherein the resonant frequencies of the input piezoelectric transducer and the output piezoelectric transducer are matched to the frequency of the radio frequency of a signal which is modulated.

17. The method as defined in claim 7 wherein the modular output is shifted 180 degrees out of phase from the modulator input.

18. The method as defined in claim 7 wherein the radio frequency signal is a sinusoidal signal.

19. The method as defined in claim 18 wherein the radio frequency signal has a frequency less than 100 MHz.

20. The method as defined in claim 7 wherein the pole voltage applied the one of the transducers is V of either positive or negative voltage, and the pole voltage applied to the other of the transducers switches between +V and −V voltages.

\* \* \* \* \*